(12) United States Patent
Zia et al.

(10) Patent No.: US 9,389,290 B2
(45) Date of Patent: Jul. 12, 2016

(54) SYSTEM AND METHOD FOR INSULATING A CRYOGEN VESSEL

(75) Inventors: Jalal Hunain Zia, Florence, SC (US); William Einziger, Florence, SC (US); William Rutherford, Florence, SC (US)

(73) Assignee: General Electric Company, Schenectady, NY (US)

( * ) Notice: Subject to any disclaimer, the term of this patent is extended or adjusted under 35 U.S.C. 154(b) by 1226 days.

(21) Appl. No.: 13/159,253

(22) Filed: Jun. 13, 2011

(65) Prior Publication Data

US 2012/0313642 A1 Dec. 13, 2012

(51) Int. Cl.
*G01R 33/3815* (2006.01)
*H01F 6/04* (2006.01)
*G01R 33/38* (2006.01)

(52) U.S. Cl.
CPC ........ *G01R 33/3804* (2013.01); *G01R 33/3815* (2013.01); *H01F 6/04* (2013.01); *Y10T 29/49826* (2015.01); *Y10T 428/249921* (2015.04)

(58) Field of Classification Search
USPC .......................... 62/48.1–51.1; 324/300–322; 600/407–435; 382/128–131
See application file for complete search history.

(56) References Cited

U.S. PATENT DOCUMENTS

| | | | |
|---|---|---|---|
| 3,353,207 A * | 11/1967 | Weinberger | 452/3 |
| 3,647,606 A * | 3/1972 | Notaro | 428/184 |
| 3,906,769 A | 9/1975 | Maslowski | |
| 4,055,268 A | 10/1977 | Barthel | |
| 4,133,376 A | 1/1979 | Eilenberg et al. | |
| 5,143,770 A | 9/1992 | Gonczy et al. | |
| 5,224,832 A * | 7/1993 | Gonczy et al. | 112/475.08 |
| 5,651,256 A | 7/1997 | Herd et al. | |
| 6,003,320 A * | 12/1999 | Okamura et al. | 62/6 |
| 6,038,867 A | 3/2000 | Einziger et al. | |
| 6,230,500 B1 | 5/2001 | Mao et al. | |
| 6,521,077 B1 * | 2/2003 | McGivern et al. | 156/304.1 |
| 6,544,618 B1 | 4/2003 | Smith | |
| 7,270,295 B2 | 9/2007 | Bennett | |
| 2012/0313642 A1 * | 12/2012 | Zia et al. | 324/318 |

FOREIGN PATENT DOCUMENTS

| CA | 867619 A | 4/1971 |
|---|---|---|
| CN | 1358262 A | 7/2002 |

(Continued)

OTHER PUBLICATIONS

Search Report from corresponding GB Application No. GB1209702.8 dated Oct. 1, 2012.
Unofficial English Translation of Austrian Office Action and Search Report issued in connection with corresponding AT Application No. 3A675/2012-2 on Sep. 22, 2014.

(Continued)

*Primary Examiner* — Melissa Koval
*Assistant Examiner* — Tiffany Fetzner
(74) *Attorney, Agent, or Firm* — Dean D. Small; The Small Patent Law Group, LLC

(57) ABSTRACT

Systems and methods for insulating superconducting magnets, such as a cryogen vessel of a magnetic resonance imaging (MRI) system having therein one or more superconducting magnets are provided. One system includes a thermal insulator having a first plurality of reflector layers and a non-deformed spacer layer between adjacent layers in the first plurality of reflector layers. The thermal insulator further includes a second plurality of reflector layers and a deformed spacer layer between adjacent layers in the second plurality of reflector layers.

21 Claims, 6 Drawing Sheets

(56) References Cited

FOREIGN PATENT DOCUMENTS

| | | |
|---|---|---|
| DE | 19725818 A1 | 12/1998 |
| EP | 1039211 A2 | 9/2000 |
| EP | 1231426 A1 | 8/2002 |
| EP | 0977048 B1 | 12/2005 |
| JP | 60156292 UI | 10/1985 |
| JP | 2004015398 A | 1/1992 |
| JP | 2000152922 A | 6/2000 |
| JP | 2000291879 A | 10/2000 |
| JP | 2009259520 A | 11/2009 |

OTHER PUBLICATIONS

Hastings et al., "Analytical Modeling and Test Correlation of Variable Density Multilayer Insulation for Cryogenic Storage", NASA Marshall Space Flight Center, 46 pages, May 1, 2004.

Unofficial English translation of Chinese Office Action issued in connection with corresponding CN Application No. 201210193522.9 on Sep. 22, 2015.

JP OA for Application No. 2014102372193. Office Action dated Mar. 1, 2016, 2 pages.

* cited by examiner

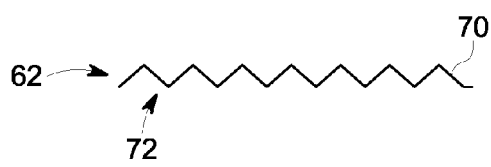
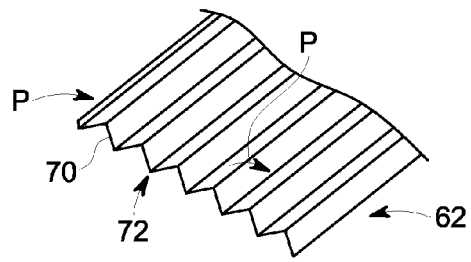
FIG. 5          FIG. 6
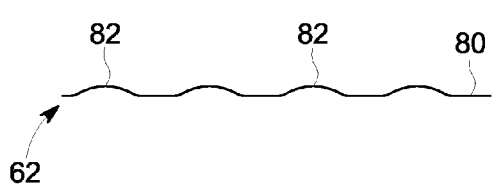
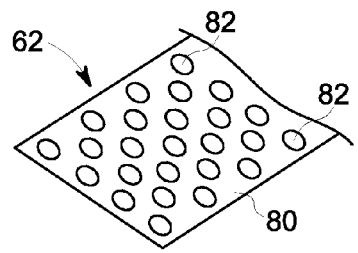
FIG. 7          FIG. 8
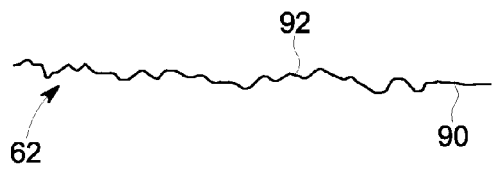
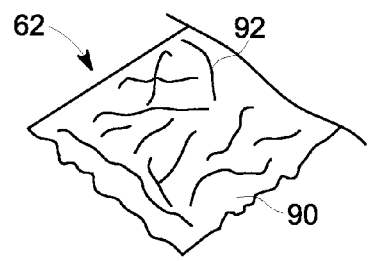
FIG. 9          FIG. 10

SYSTEM AND METHOD FOR INSULATING A CRYOGEN VESSEL

BACKGROUND OF THE INVENTION

The subject matter disclosed herein relates generally to cryogenically cooled superconducting magnets, such as for magnetic resonance imaging (MRI) systems, and more particularly to systems and methods for insulating a cryogen vessel or a thermal shield for the superconducting magnets.

In superconducting coil MRI systems, the coils forming the superconducting magnets are cryogenically cooled using a cryogen vessel, typically a helium vessel (also referred to as a cryostat). During certain operating conditions or transfer of the MRI systems, generated heat can overheat a localized area of the coil and create a normal zone, where the conductor loses the superconducting property and transfers to a normal resistive state. The normal zone will spread through the coil due to the Joule heat and the thermal conduction, which results in a quench event. The quench is accompanied by the rapid boil-off of helium escaping from the cryogen bath in which the magnet coils are immersed. Each quench, followed by the re-fill and re-ramp of the magnet, is an expensive and time consuming event. Accordingly, cooling and insulation systems for MRI systems are used to minimize the likelihood of overheating of the superconducting magnet coils.

For example, the cryogen cooling system of some of these MRI systems include a cryocooler, such as a coldhead within a coldhead sleeve that operates to recondense vaporized cryogen to continually cool the superconducting magnet coils during system operation. Additionally, thermal insulation may be provided around the helium vessel to insulate the helium, such as from external thermal radiation or other forms of heat transfer into and out of the helium vessel. However, in order to provide the insulation or increase the thermal insulation properties of these conventional thermal insulations, additional thermal layers or costly modifications are needed.

BRIEF DESCRIPTION OF THE INVENTION

In accordance with various embodiments, a thermal insulator for a superconducting magnet is provided that includes a first plurality of reflector layers and a non-deformed spacer layer between adjacent layers in the first plurality of reflector layers. The thermal insulator further includes a second plurality of reflector layers and a deformed spacer layer between adjacent layers in the second plurality of reflector layers.

In accordance with other embodiments, a magnetic resonance imaging (MRI) magnet system is provided that includes a vessel having liquid helium therein and a superconducting magnet within the vessel. The MRI magnet system also includes a thermal shield surrounding the helium vessel. The MRI magnet system also includes a thermal insulator surrounding at least a portion of at least one of the vessel or the thermal shield, wherein the thermal insulator comprises a plurality of reflector layers having a non-deformed spacer layer between adjacent reflector layers, and a plurality of reflector layers having a deformed spacer layer between adjacent reflector layers.

In accordance with yet other embodiments, a method for forming a thermal insulator for a magnetic resonance imaging system (MRI) is provided. The method includes deforming a plurality of spacer layers and stacking a first plurality of reflector layers with non-deformed spacer layers therebetween. The method also includes stacking a second plurality of reflector layers with deformed spacer layers therebetween. The method further includes forming a multi-layer thermal insulator with the first and second pluralities of reflector layers.

BRIEF DESCRIPTION OF THE DRAWINGS

FIG. 5 is an elevation view of a spacer layer formed in accordance with one embodiment.

FIG. 6 is a perspective view of the spacer layer of FIG. 5.

FIG. 7 is an elevation view of a spacer layer formed in accordance with another embodiment.

FIG. 8 is a perspective view of the spacer layer of FIG. 7.

FIG. 9 is an elevation view of a spacer layer formed in accordance with another embodiment.

FIG. 10 is a perspective view of the spacer layer of FIG. 9.

DETAILED DESCRIPTION OF THE INVENTION

Figure 1:
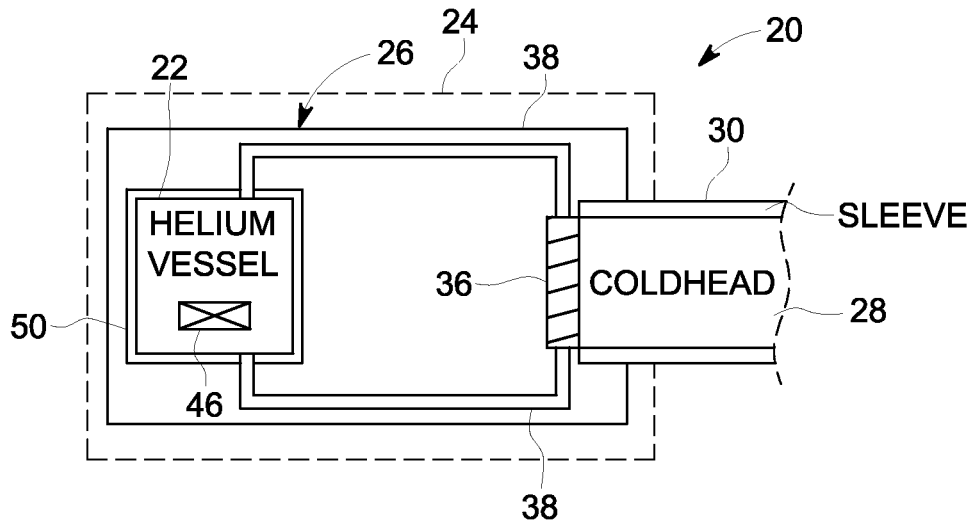
FIG. 1 is a simplified block diagram of a magnetic resonance imaging (MRI) magnet system illustrating thermal insulation formed in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for thermally insulating a magnetic resonance imaging (MRI) system, and in particular, thermally insulating the cryogen vessel of the MRI system. In particular, multi-layered insulation (MLI) for a cryogen vessel having reflector layers and spacer layers may be provided for insulating MRI magnets within the cryogen vessel. In various embodiments, one or more of the spacer layers are deformed (e.g., pleated, embossed or crinkled), such as from a generally smooth or planar sheet form. As used herein, deforming the spacer layers refers to any type of deformation, such as changing the shape, texture, etc. of the spacer layers.

By practicing at least one embodiment, the loft or conduction distance between adjacent layers of the MRI structure is increased and the contact surface area between the spacer and reflector layer is also decreased, which lowers the conduction heat leak. Additionally, a reduced number of layers also may be used to provide a same level of heat leak performance.

Figure 2:
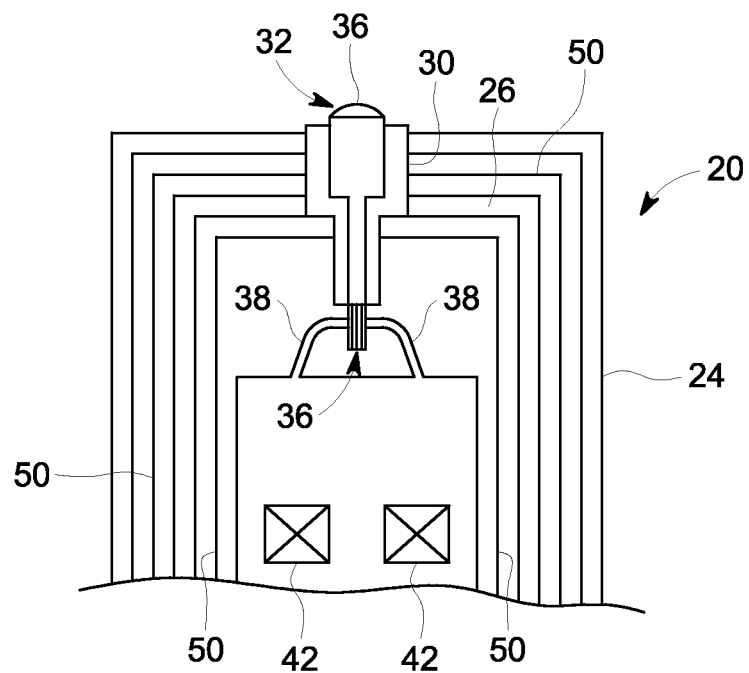
FIG. 2 is a diagram illustrating a thermal insulation arrangement for a cryogen vessel formed in accordance with various embodiments.

FIGS. 1 and 2 illustrate embodiments having a MLI formed in accordance with various embodiments. Specifically, FIGS. 1 and 2 are simplified block diagrams illustrating a superconducting magnet system, such as an MRI magnet system 20, which includes one or more superconducting magnets. It should be noted that like numerals represent like parts throughout the Figures. Additionally, it should be noted that the relative positions of the various embodiments are shown for ease of illustration and do not necessarily represent the positioning or orientation of the various components in the various embodiments.

The MRI magnet system 20 includes a vessel 22 that holds a liquid cryogen, such as liquid helium. Thus, in this embodiment, the vessel 22 is a helium vessel, which also may be referred to as a helium pressure vessel. The vessel 22 is surrounded by a vacuum vessel 24 and includes a thermal shield 26 therein and/or therebetween. The thermal shield 26 may be, for example, a thermally isolating radiation shield. A coldhead 28, which in various embodiments is a cryocooler, extends through the vacuum vessel 24 within a coldhead sleeve 30 (e.g., a housing). Thus, the cold end of the coldhead 28 may be positioned within the coldhead sleeve 30 without affecting the vacuum within the vacuum vessel 24. The coldhead 28 is inserted (or received) and secured within the coldhead sleeve 30 using any suitable means, such as one or more flanges and bolts, or other means known in the art. Moreover, a motor 32 of the coldhead 28 is provided outside the vacuum vessel 24.

As illustrated in FIG. 2, the coldhead sleeve 30 in various embodiments includes a recondenser 36 at a lower end of the coldhead sleeve 30 having a portion thereof that may extend into the helium vessel 22. The recondenser 36 recondenses boiled off helium gas from the helium vessel 22. The recondenser 36 is also coupled to the helium vessel 22 via one or more passageways 38. For example, the passageways 38 may be provided from the helium vessel 22 to the recondenser 36 for transferring boiled off helium gas from the helium vessel 22 to the recondenser 36, which then may transfer back recondensed helium liquid to the helium vessel 22 at the open end 34.

A magnet 46, which in various embodiments is a superconducting magnet, is provided inside the helium vessel 22 and is controlled during operation of the MRI system as described in more detail herein to acquire MRI image data. Additionally, during operation of the MRI system, liquid helium within the helium vessel 22 of the MRI magnet system 20 cools the superconducting magnet 46, which may be configured as a coil assembly as is known. The superconducting magnet 46 may be cooled, for example, to a superconducting temperature, such as 4.2 Kelvin (K). The cooling process may include the recondensing of boiled off helium gas to liquid by the recondenser 36 and returned to the helium vessel 22. It should be noted that the boiled off helium may also pass through one or more optional gas passageways (not shown) that connect the helium vessel 22 to the thermal shield 26.

In various embodiments, a thermal insulator 50 is provided around the helium vessel 22, which in one embodiment is formed as a MLI structure. For example, the MLI structure may include a plurality of reflector layers and a plurality of spacer layers as described below.

Figure 3:
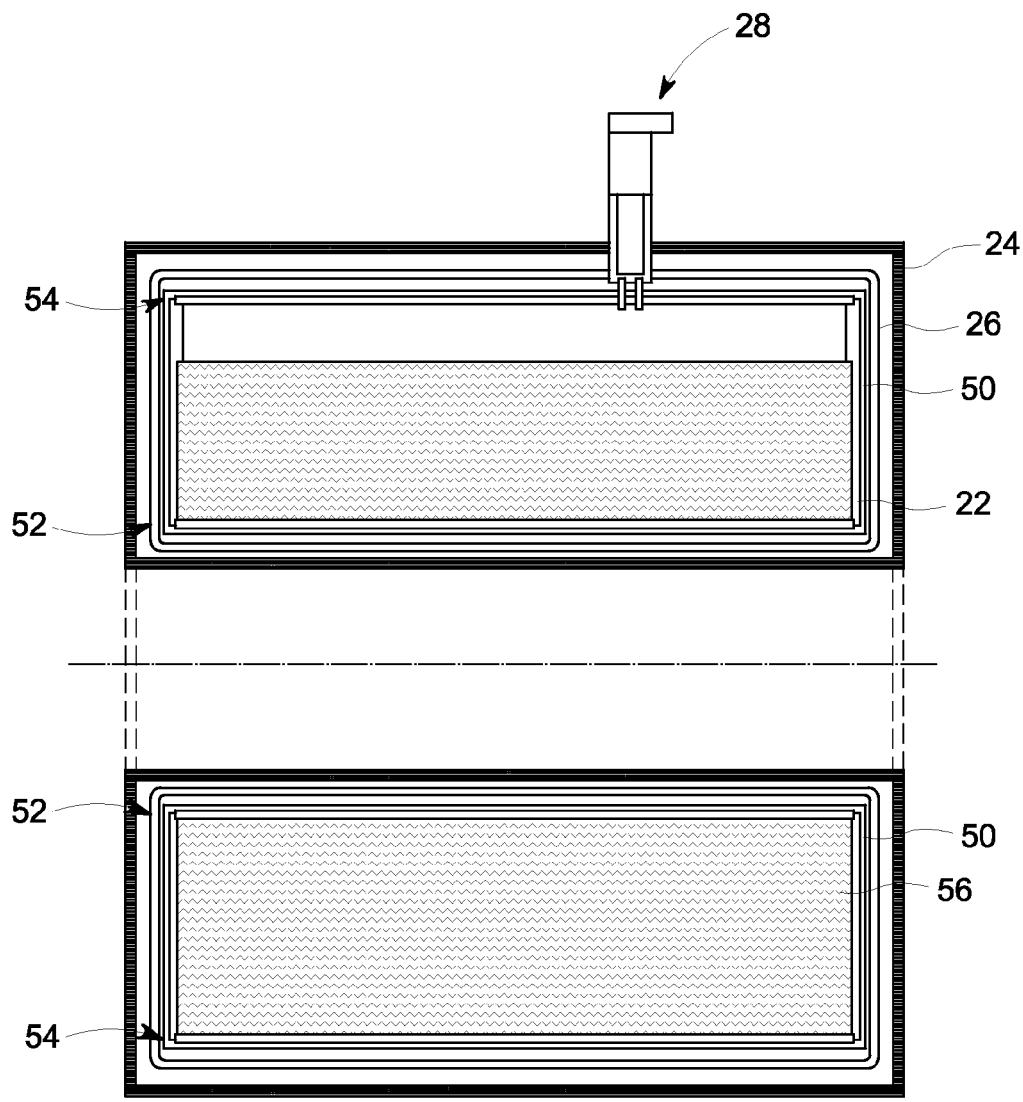
FIG. 3 is a simplified diagram illustrating a thermal insulation arrangement formed in accordance with one embodiment.

In various embodiments, the thermal insulator 50 defines a thermal insulation blanket that surrounds all or a portion of the helium vessel 22 and/or the thermal shield 26 (shown surrounding both the helium vessel 22 and the thermal shield 26 in FIGS. 1 and 2 for illustration only). For example, the thermal insulator 50 may extend circumferentially around the helium vessel 22 (having liquid helium 56 therein), which may include surrounding an inner diameter surface 52 and an outer diameter surface 54 as illustrated in FIG. 3, showing a simplified diagram of the arrangement. However, the thermal insulator 50 may extend only along portions of the surface of the helium vessel 22, for example, along sides, but not along the ends thereof. In other embodiments, the thermal insulator 50 defines a thermal insulation blanket that surrounds a potion of the thermal shield 26 only or the thermal shield 26 only. In still other embodiments, the thermal insulator 50 defines a thermal insulation blanket that surrounds both the helium vessel 22 and the thermal shield 26 (which may be, for example, two blankets or a single blanket structure). The thermal insulator 50 may be provided or positioned surrounding the helium vessel 22, the thermal shield 26 or both in any suitable manner.

Figure 4:
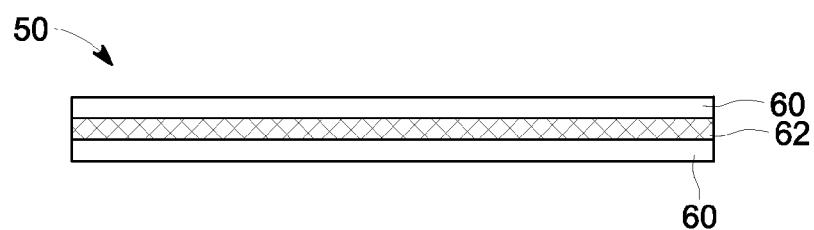
FIG. 4 is a block diagram of a portion of a thermal insulator formed in accordance with various embodiments.

The thermal insulator 50 includes a plurality of layers as shown in FIG. 4, wherein a portion of the thermal insulator 50 includes at least one deformed spacer layer 62 provided between at least one reflector layer 60 on each side thereof. Accordingly, the spacer layer(s) 62 is sandwiched or positioned between two reflector layers 60, such as adjacent layers. It should be noted that adjacent layers are not necessarily abutting layers. Thus, the spacer layer 62 may be disposed between two reflector layers 60 and extend therebetween from one reflector layer 60 to the next reflector layer 60 (or less than the distance between the two reflector layers 60). The reflector layers 60 and the spacer layers 62 may be formed from any suitable material for insulating the helium vessel 22 and/or the thermal shield 26, which may include reducing heat transfer both into and out of the helium vessel 22 and/or the thermal shield 26. As described in more detail below, the configuration and arrangement of the layers in various embodiments is provided differently at a cold end of the thermal insulator 50, namely the end closer to the surface of the helium vessel 22 and/or the thermal shield 26, and a warm end of the thermal insulator 50, namely the end farther away from the surface of the helium vessel 22 and/or the thermal shield 26.

Merely for exemplary purposes, the reflector layers 60 may be formed from a Double-Aluminized Mylar (DAM) material. However, the reflector layers 60 may be formed, for example, from different polymers having reflective surfaces, such as coated on both sides thereof with a reflective material. The spacer layers 62 may be formed, for example, from any type of non-conductive polymer layer, such as a woven cloth material, silk or rayon net or mesh, spunbonded polyester, among others. The spacer layers 62 may be formed from a material that has a thermal conductivity allowing heat to conduct from one reflector layer 60 to the next reflector layer 60. The spacer layers 62 generally define a space between adjacent reflector layers 60 and maintain the distance between the adjacent spacer layers 62.

The spacer layers 62 are deformed such that the layers may be formed from sheets of material that are deformed such that the sheets are not planar. For example, the spacer layers 62 are deformed such that when the spacer layers 62 surround the helium vessel 22 and/or the thermal shield 26, the spacer layers 62 do not have a constant diameter or thickness as the spacer layers 62 extend circumferentially around the helium vessel 22 and/or the thermal shield 26. Thus, the spacer layers 62 are not smooth along a surface thereof, but have a varied height or thickness.

The spacer layers 62 may be take any form or shape. FIGS. 5 though 10 illustrate different embodiments of spacer layers 62 that may be provided. However, variations are contemplated, and the spacer layers 62 may be any type of deformed layer. For example, as shown in FIGS. 5 and 6, the spacer layers 62 may be formed from a generally folded or pleated structure 70. It should be noted that although the pleats 72 are shown as having a generally triangular cross-section, the pleats 72 may take different shapes and forms. For example, the pleats 72 may have rounded ends or other polygonal configurations. Additionally, the width and height of the pleats 72 may be varied, for example, based on a desired or required distance between adjacent reflector layers 60. It should be noted that the pleats 72 may fold back upon each other to different degrees (as illustrated by the arrows P) or not at all. Additionally, the pleats 72 may extend along all or a portion of the spacer layer 62, as well as extend in one direction or multiple different directions. The pleating of the pleated structure 70 may be performed using any suitable pleating process, such as by a sewing process, a pressing process or a gluing process, among others.

As another example of a variation to the spacer layers 62, as shown in FIGS. 7 and 8, an embossed structure 80 may be provided. The embossed structure 80 includes raised portions 82. It should be noted that the raised portions 82 may be sized and shaped differently and are not limited to the circular shapes and spacing shown in FIGS. 7 and 8. For example, the embossing may include forming raised portions 82 that have square, rectangular, triangular, polygonal or other shapes. Additionally, the spacing between the raised portions 82 may be the same or varied, and the number of raised portions 82 may be changed as desired or needed, as well as be provided along all or a portion of the embossed structure 80. Additionally, the width and height of the raised portions 82 may be varied, for example, based on a desired or required distance between adjacent reflector layers 60.

The embossing to form the raised portions 82 may be performed using any suitable embossing process, such as by applying heat and/or pressure with dies (e.g., male and female copper or brass dies) that fit together and deform (e.g., squeeze) the embossed structure 80, such as fibers of the substrate of the embossed structure 80.

As another example of a variation to the spacer layers 62, as shown in FIGS. 9 and 10, a crinkled structure 90 may be provided. The crinkled structure 90 includes creases 92 within the substrate forming the spacer layers 62. It should be noted that the creases 92 may be, for example, any type of wrinkling, rippling or waving of the substrate such that the height or thickness of the substrate varies. The width and height of the creases 92 may be varied, for example, based on a desired or required distance between adjacent reflector layers 60. It should be noted that the creases 92 may be formed randomly as shown in FIGS. 9 and 10, having different heights or depths, or alternatively may be formed uniformly. The creases 92 may extend in the same direction or different directions, as well as along all or a portion of the crinkled structure 90.

The crinkling to form the creases 92 may be performed using any suitable process, such as by manipulating the substrate forming the crinkled structure 90 to form creases or folds, among other variations in the surface of the structure.

In various embodiments, the spacer layers 62 that are deformed are provided in-between reflector layers 60 in a portion of the thermal insulator 50. Additionally, spacer layers 100 that are not deformed are provided in-between other reflector layers 60 in a portion of the thermal insulator 50, which is shown diagrammatically in FIG. 11. The spacer layers 100 may be formed from generally planar sheets of material (e.g., non-conductive polymer material) that are not deformed, such that when the spacer layers 100 extend around the helium vessel 22 and/or the thermal shield 26, the spacer layers 100 have a constant diameter or thickness as the spacer layers 100 extend circumferentially around the helium vessel 22. Thus, the spacer layers 100 are generally smooth along a surface thereof with a constant height or thickness.

Figure 11:
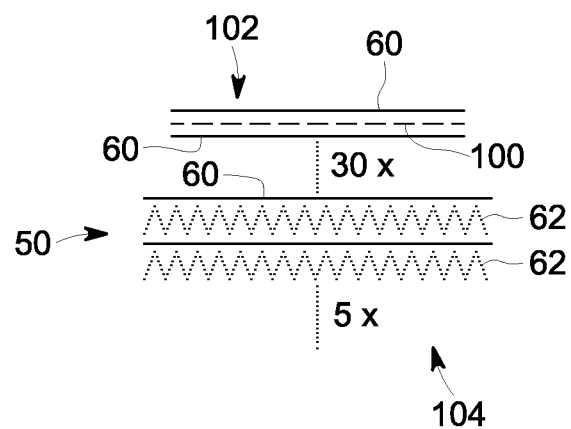
FIG. 11 is a diagrammatic illustration of a multi-layer thermal insulator formed in accordance with one embodiment.
Figure 12:
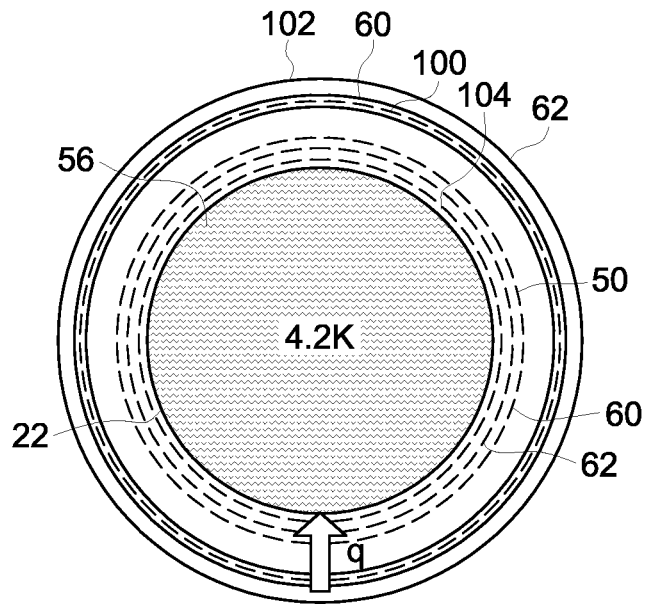
FIG. 12 is a diagrammatic illustration of a multi-layer thermal insulator formed in accordance with one embodiment within an MRI system.

In one embodiment, as shown in FIG. 11, a plurality of spacer layers 100 are provided between adjacent reflector layers 60 at a warm end 102 of the thermal insulator 50, which is the end farther (distal to) to the helium vessel 22 (as shown in FIG. 12) or the thermal shield 26. The arrangement of one or more spacer layers 100 between adjacent reflector layers 60 is repeated, for example, thirty times to form a portion of the thermal insulator 50. Thereafter, a plurality of spacer layers 62 are provided between adjacent reflector layers 60 at a cold end 104 of the thermal insulator 50, which is the end closer to (proximate to) the helium vessel 22 (as shown in FIG. 12) or the thermal shield 26. The arrangement of one or more spacer layers 62 between adjacent reflector layers 60 is repeated, for example, five times to form a portion of the thermal insulator 50. It should be noted that the number of times the different arrangements are repeated may be varied and also may be provided at different portions along the thermal insulator 50 and not just on two different portions. For example, the repeating arrangement of one or more spacer layers 62 between adjacent reflector layers 60 may be provided between two and five times in some embodiments. The various layers may be joined or coupled using any suitable fastening or adhering means. It should be noted that the thermal insulator 50 may thereafter be provided surrounding the helium vessel and in thermal contact therewith or at another location within the vacuum vessel 24 of the MRI system, such as surrounding the thermal shield 26.

It should be noted that in various embodiments, the reflector layers 60 are not deformed, for example, formed from planar sheets of reflector material. However, optionally, one or more of the reflector layers 60 may be deformed similar to the deformation of the spacer layers 62. It should also be noted that the thickness of the layers may be the same or different, and may be varied or constant throughout the thermal insulator 50.

Figure 13:
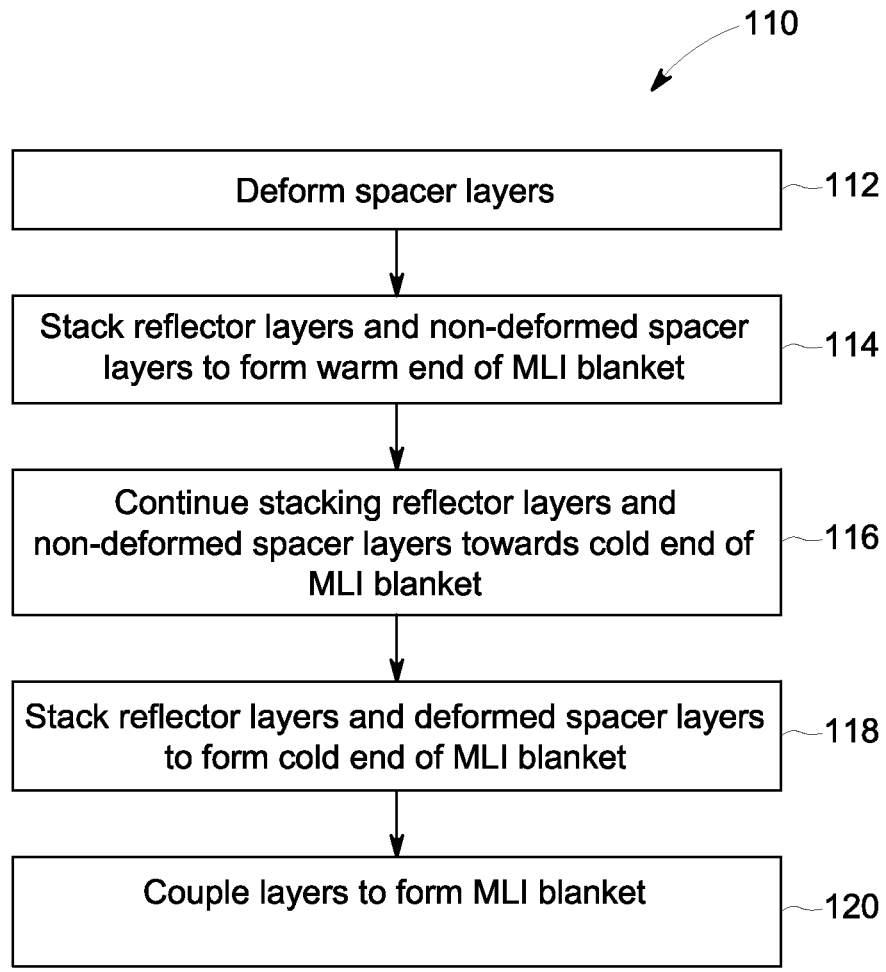
FIG. 13 is a flowchart of a method for forming a thermal insulator in accordance with various embodiments.

In accordance with various embodiments, a method 110 as shown in FIG. 13 also may be provided for forming a thermal insulator, such as the thermal insulator 50, which may define, for example, an MLI blanket. The method 110 includes deforming a plurality of spacer layers at 112, such as forming spacer layers having a varied thickness in cross-section. Thereafter, at 114, a plurality of reflector layers are stacked with non-deformed spacer layers (e.g., constant thickness spacer layers) between the reflector layers to form a warm end of an MLI blanket, which stacking is continued towards a cold end of the MLI blanket at 116. The stacking is then continued at 118 with a plurality of reflector layers stacked with deformed spacer layers between the reflector layers to form a cold end of the MLI blanket. Once a desired or required number of layers have been stacked (e.g., thirty sandwiched layers in steps 114 and 116, and five sandwiched layers in step 118) the layers are coupled together at 120. It should be noted that the layers may be coupled together as the layers are being stacked or after the stack is completed. Additionally, post forming processes may be performed, such as to seal the MLI blanket.

Thus, in accordance with various embodiments, a thermal insulator for an MRI system is provided. For example, an MLI blanket may be formed for a helium vessel or a thermal shield or both of the MRI system, which may be a variable density MLI blanket.

It should be noted that although some embodiments may be described in connection with superconducting magnets for MRI systems, the various embodiments may be implemented in connection with any type of system having superconducting magnets. The superconducting magnets may be implemented in other types of medical imaging devices, as well as non-medical imaging devices.

Thus, the various embodiments may be implemented in connection with different types of superconducting coils, such as superconducting coils for an MRI system. For example, the various embodiments may be implemented with superconducting coils for use with the MRI system 140 shown in FIG. 14. It should be appreciated that although the system 140 is illustrated as a single modality imaging system, the various embodiments may be implemented in or with multi-modality imaging systems. The system 140 is illustrated as an MRI imaging system and may be combined with different types of medical imaging systems, such as a computed tomography (CT), positron emission tomography (PET), a single photon emission computed tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Figure 14:
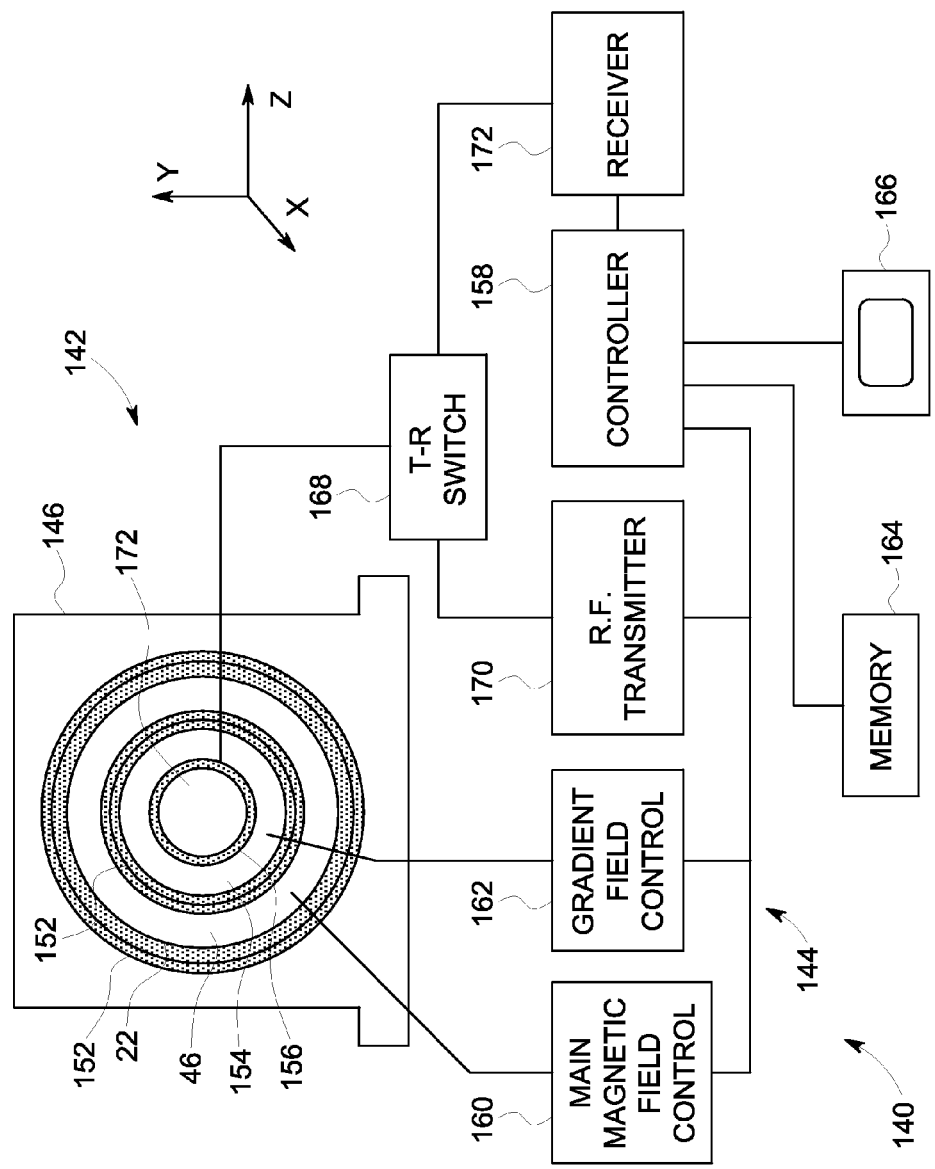
FIG. 14 is a block diagram of an MRI system in which thermal insulation formed in accordance with various embodiments may be implemented.

Referring to FIG. 14, the MRI system 140 generally includes an imaging portion 142 and a processing portion 144 that may include a processor or other computing or controller device. The MRI system 140 includes within a cryostat, namely the helium vessel 22 a superconducting magnet 46 formed from coils, which may be supported on a magnet coil support structure. The helium vessel 22 surrounds the superconducting magnet 46 and is filled with liquid helium.

Thermal insulation 152 is provided surrounding all or a portion of the outer surface of the helium vessel 22 and/or the thermal shield 26 (shown in FIGS. 1 and 2). The thermal insulation 152 may take the form of the thermal insulator 50 as described herein. A plurality of magnetic gradient coils 154 are provided inside the superconducting magnet 46 and an RF transmit coil 156 is provided within the plurality of magnetic gradient coils 154. In some embodiments, the RF transmit coil 156 may be replaced with a transmit and receive coil. The components within the gantry 146 generally form the imaging portion 142. It should be noted that although the superconducting magnet 46 is a cylindrical shape, other shapes of magnets can be used.

The processing portion 144 generally includes a controller 158, a main magnetic field control 160, a gradient field control 162, a memory 164, a display device 166, a transmit-receive (T-R) switch 168, an RF transmitter 170 and a receiver 172.

In operation, a body of an object, such as a patient or a phantom to be imaged, is placed in a bore 174 on a suitable support, for example, a patient table. The superconducting magnet 46 produces a uniform and static main magnetic field $B_o$ across the bore 174. The strength of the electromagnetic field in the bore 174 and correspondingly in the patient, is controlled by the controller 158 via the main magnetic field control 160, which also controls a supply of energizing current to the superconducting magnet 46.

The magnetic gradient coils 154, which include one or more gradient coil elements, are provided so that a magnetic gradient can be imposed on the magnetic field $B_o$ in the bore 174 within the superconducting magnet 46 in any one or more of three orthogonal directions x, y, and z. The magnetic gradient coils 154 are energized by the gradient field control 162 and are also controlled by the controller 158.

The RF transmit coil 156, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 156.

The RF transmit coil 156 and the receive surface coil are selectably interconnected to one of the RF transmitter 170 or receiver 172, respectively, by the T-R switch 168. The RF transmitter 170 and T-R switch 168 are controlled by the controller 158 such that RF field pulses or signals are generated by the RF transmitter 170 and selectively applied to the patient for excitation of magnetic resonance in the patient. While the RF excitation pulses are being applied to the patient, the T-R switch 168 is also actuated to disconnect the receive surface coil from the receiver 172.

Following application of the RF pulses, the T-R switch 168 is again actuated to disconnect the RF transmit coil 156 from the RF transmitter 170 and to connect the receive surface coil to the receiver 172. The receive surface coil operates to detect or sense the MR signals resulting from the excited nuclei in the patient and communicates the MR signals to the receiver 172. These detected MR signals are in turn communicated to the controller 158. The controller 158 includes a processor (e.g., image reconstruction processor), for example, that controls the processing of the MR signals to produce signals representative of an image of the patient.

The processed signals representative of the image are also transmitted to the display device 166 to provide a visual display of the image. Specifically, the MR signals fill or form a k-space that is Fourier transformed to obtain a viewable image. The processed signals representative of the image are then transmitted to the display device 166.

The various embodiments and/or components, for example, the modules, or components and controllers therein, such as of the MRI system 140, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a floppy disk drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" may include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A thermal insulator configured for a superconducting magnet of a magnetic resonance imaging system, the thermal insulator having the form of a multi-layered insulation (MLI) blanket comprising:
   a first plurality of reflector layers;
   a non-deformed spacer layer located between each of the multiple adjacent layers within the first plurality of reflector layers;
   a second plurality of reflector layers; and
   a deformed non-smooth, non-planar sheet spacer layer that is located between each of the multiple adjacent layers within the second plurality of reflector layers.

2. The thermal insulator of claim 1, wherein the first plurality of reflector layers define a warm end of the multi-layered insulation (MLI) blanket that is configured to be positioned distal to at least one of a helium vessel or a thermal shield.

3. The thermal insulator of claim 1, wherein the second plurality of reflector layers define a cold end of the multi-layered insulation (MLI) blanket that is configured to be positioned proximate to at least one of a helium vessel or a thermal shield.

4. The thermal insulator of claim 1, wherein the deformed non-smooth, non-planar sheet spacer layer comprises a pleated structure.

5. The thermal insulator of claim 1, wherein the deformed non-smooth, non-planar sheet spacer layer comprises an embossed structure.

6. The thermal insulator of claim 1, wherein the deformed non-smooth, non-planar sheet spacer layer comprises a crinkled structure.

7. The thermal insulator of claim 1, wherein the deformed non-smooth, non-planar sheet spacer layer has a varied thickness.

8. The thermal insulator of claim 1, wherein a number of the first plurality of reflector layers is greater than a number of the second plurality of reflector layers.

9. The thermal insulator of claim 8, further comprises thirty sets of the first plurality of reflector layers, with non-deformed spacer layers therebetween; and five sets of the second plurality of reflector layers, with deformed non-smooth, non-planar sheet spacer layers therebetween.

10. The thermal insulator of claim 1, wherein the first and second pluralities of reflector layers are formed from generally planar material sheets.

11. The thermal insulator of claim 1, wherein the combination of the first and second plurality of reflector layers combined with the non-deformed spacer layers and the deformed non-smooth, non-planar sheet spacer layers form the MLI blanket that is part of the MRI system.

12. A magnetic resonance imaging (MRI) magnet system comprising:
   a vessel having liquid helium therein;
   a thermal shield surrounding the vessel;
   a superconducting magnet located within the vessel; and
   a thermal insulator surrounding at least a portion of at least one of the vessel or the thermal shield, wherein the thermal insulator comprises:
a first plurality of reflector layers having a non-deformed spacer layer located between each of the adjacent reflector layers within the plurality of reflector layers, and
a second plurality of reflector layers having a deformed non-smooth, non-planar sheet spacer layer;
wherein the combination of the plurality of reflector layers, and the additional plurality of reflector layers combined with the non-deformed spacer layers and the deformed non-smooth, non-planar sheet spacer layers form a multi-layered insulation (MLI) blanket insulating at least one of the vessel or the thermal shield, that is part of the MRI system.

13. The MRI magnet system of claim 12, wherein the second plurality of reflector layers having the deformed non-smooth, non-planar sheet spacer layers therebetween are positioned proximate to and in thermal contact with at least one of the vessel or the thermal shield.

14. The MRI magnet system of claim 12, wherein each of the deformed non-smooth, non-planar sheet spacer layer comprises a pleated structure.

15. The MRI magnet system of claim 12, wherein each of the deformed non-smooth, non-planar sheet spacer layer(s) comprises an embossed structure.

16. The MRI magnet system of claim 12, wherein each of the deformed non-smooth, non-planar sheet spacer layer(s), comprises a crinkled structure.

17. The MRI magnet system of claim 12, wherein each of the deformed non-smooth, non-planar sheet spacer layer(s) has a varied thickness.

18. The MRI magnet system of claim 12, wherein a number of the plurality of reflector layers, having the non-deformed spacer layer therebetween each adjacent reflector layer, within the plurality of reflector layers, is greater than a number of the additional plurality of reflector layers, having the deformed non-smooth, non-planar sheet spacer layers(s).

19. The MRI magnet system of claim 18, wherein the MLI blanket has non-deformed spacer layers and five deformed non-smooth, non-planar sheet spacer layers.

20. A method of forming a thermal insulator in the form of a multilayered insulation (MLI) blanket that is used with a magnetic resonance imaging system (MRI), the method comprising:
deforming a plurality of spacer layers by having the plurality of spacer layers be non-smooth, non-planar sheets;
stacking a first plurality of reflector layers with non-deformed spacer layers therebetween;
stacking a second plurality of reflector layers with the plurality of deformed non-smooth, non-planar spacer layers therebetween; and
forming a multi-layer thermal insulator, in the form of a Multi-Layered Insulation (MLI) blanket, from the stacked first and second pluralities of reflector layers, which contain the non-deformed spacer layers and the deformed non-smooth, non-planar sheet spacer layers.

21. The method of claim 20, wherein the step of deforming the plurality of spacer layers having the plurality deformed non-smooth, nonplanar sheet spacer layers comprises one of pleating, embossing or crinkling the plurality of spacer layers in order to cause the plurality of spacer layers to become non--smooth, non-planer sheets.

* * * * *